United States Patent
Avoyan et al.

(10) Patent No.: US 10,391,526 B2
(45) Date of Patent: Aug. 27, 2019

(54) ELECTROSTATIC CHUCK CLEANING FIXTURE

(71) Applicant: Lam Research Corporation, Fremont, CA (US)

(72) Inventors: Armen Avoyan, Oakland, CA (US); Cliff LaCroix, Livermore, CA (US); Hong Shih, Walnut, CA (US); Kennet Baylon, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 970 days.

(21) Appl. No.: 14/104,356

(22) Filed: Dec. 12, 2013

(65) Prior Publication Data

US 2015/0165492 A1   Jun. 18, 2015

(51) Int. Cl.
*H01L 21/683* (2006.01)
*B08B 3/12* (2006.01)
(Continued)

(52) U.S. Cl.
CPC .................. *B08B 3/12* (2013.01); *B08B 3/02* (2013.01); *B08B 17/04* (2013.01);
(Continued)

(58) Field of Classification Search
CPC ............. H01L 21/6831; H01L 21/6833; H01L 21/67051
See application file for complete search history.

(56) References Cited

U.S. PATENT DOCUMENTS 5,539,609 A * 7/1996 Collins ............... H01L 21/6833
361/234
6,077,384 A * 6/2000 Collins .................. A21D 2/185
118/723 I
(Continued)

FOREIGN PATENT DOCUMENTS

JP           2896155 B2 *  5/1999  ......... H01L 21/6833
KR    20020073711 A  *  9/2002
WO       2005112093 A2     11/2005

OTHER PUBLICATIONS

JP2896155—Abstract, May 1999.*
KR20020073711—Machine Translation, Sep. 2002.*

*Primary Examiner* — Marc Lorenzi
(74) *Attorney, Agent, or Firm* — Beyer Law Group LLP

(57) ABSTRACT

A cleaning fixture assembly for protecting an electrostatic chuck suitable for supporting semiconductor substrates during a cleaning process contains a plate configured to align with and engage a backside of the electrostatic chuck, the plate having an annular seal portion surrounding a pocket. The cleaning fixture assembly also contains a first O-ring engaging the annular seal portion of the plate, a plurality of through-holes in the pocket of the plate, and a plurality of O-rings surrounding the plurality of through-holes in the pocket of the plate. The plurality of through-holes are configured to be aligned with and in fluid communication with lift pin holes and helium holes in the backside of the electrostatic chuck, and the plurality of O-rings are positioned to allow cleaning media to engage the lift pin holes and helium holes in the electrostatic chuck during a cleaning process while sealing the cleaning media from reaching the backside of the electrostatic chuck.

13 Claims, 3 Drawing Sheets

(51) Int. Cl.
    *B08B 3/02*    (2006.01)
    *B08B 17/04*   (2006.01)
    *H01L 21/67*   (2006.01)
    *B08B 9/00*    (2006.01)

(52) U.S. Cl.
    CPC .... *H01L 21/67051* (2013.01); *H01L 21/6831* (2013.01); *B08B 9/00* (2013.01); *Y10T 137/0402* (2015.04); *Y10T 137/4238* (2015.04)

(56) References Cited

U.S. PATENT DOCUMENTS

| | | | |
|---|---|---|---|
| 6,656,894 B2 | 12/2003 | Peters et al. | |
| 6,810,887 B2 | 11/2004 | Tan | |
| 6,821,350 B2 | 11/2004 | Krogh | |
| 6,897,161 B2 | 5/2005 | Suzuki | |
| 7,045,019 B1 | 5/2006 | Hemker et al. | |
| 7,045,020 B2 | 5/2006 | Bhatnagar et al. | |
| 7,052,553 B1 | 5/2006 | Shih et al. | |
| 7,247,579 B2 | 7/2007 | Ren et al. | |
| 7,442,114 B2 | 10/2008 | Huang et al. | |
| 7,498,269 B2 | 3/2009 | Ren et al. | |
| 7,507,670 B2 | 3/2009 | Shih et al. | |
| 7,572,342 B2 | 8/2009 | Jacobson | |
| 7,578,889 B2 | 8/2009 | Shih et al. | |
| 7,648,582 B2 | 1/2010 | Steger | |
| 7,736,441 B2 | 6/2010 | Outka et al. | |
| 7,767,028 B2 | 8/2010 | Augustino et al. | |
| 7,942,973 B2 | 5/2011 | Shih et al. | |
| 8,215,321 B2 | 7/2012 | Shih et al. | |
| 8,221,552 B2 | 7/2012 | Outka et al. | |
| 8,545,639 B2 | 10/2013 | Shin et al. | |
| 2003/0168439 A1* | 9/2003 | Kanno | H01L 21/67109 219/390 |
| 2003/0200996 A1 | 10/2003 | Hiatt et al. | |
| 2003/0221702 A1 | 12/2003 | Peebles | |
| 2004/0045813 A1* | 3/2004 | Kanno | C25D 5/18 204/242 |
| 2006/0002053 A1* | 1/2006 | Brown | H01L 21/6831 361/234 |
| 2008/0089001 A1* | 4/2008 | Parkhe | H01L 21/6831 361/234 |
| 2011/0265821 A1 | 11/2011 | Tay et al. | |
| 2012/0073596 A1 | 3/2012 | Holsteyns et al. | |
| 2013/0104938 A1 | 5/2013 | Avoyan et al. | |

\* cited by examiner

ELECTROSTATIC CHUCK CLEANING FIXTURE

FIELD

The present disclosure pertains to methods and apparatuses for cleaning semiconductor processing equipment, and relates more particularly to cleaning an electrostatic chuck.

BACKGROUND INFORMATION

An electrostatic chuck (ESC) is a component of semiconductor processing equipment such as plasma etch chambers, and can be used for transporting, holding, and/or temperature control of a semiconductor wafer or glass substrate (i.e., flat panel display) during processing, such as in a chemical vapor deposition (CVD), physical vapor deposition (PVD), or etch reactor. ESCs often exhibit short lifetimes resulting in failures including, for example, dynamic alignment failure, high leakage of helium cooling gas between the ESC and the underside of a supported substrate, increased dechucking time, and sticking of the substrate to the ESC or dechucking feature. The early failure of ESCs can cause substrate breakage, impact throughput, lead to particle and defect issues, and increase ownership costs of plasma processing equipment incorporating such ESCs.

SUMMARY

In embodiments, the present disclosure provides a cleaning fixture assembly for protecting an electrostatic chuck during a cleaning process. In embodiments, the electrostatic chuck is suitable for supporting semiconductor substrates. In embodiments, the cleaning fixture assembly includes a plate configured to align with and engage a backside of an electrostatic chuck, the plate having an annular seal portion surrounding a pocket; a first O-ring engaging the annular seal portion of the plate; a plurality of through-holes in the pocket of the plate; and a plurality of O-rings surrounding the plurality of through-holes in the pocket of the plate. In embodiments, the plurality of through-holes are configured to be aligned with and in fluid communication with lift pin holes and helium holes in the backside of the electrostatic chuck, and the plurality of O-rings are positioned to allow cleaning media to engage the lift pin holes and helium holes in the electrostatic chuck during a cleaning process while sealing the cleaning media from reaching the backside of the electrostatic chuck.

In embodiments, the present disclosure further provides an electrostatic chuck mounted on a cleaning fixture assembly for protecting the electrostatic chuck during a cleaning process. In embodiments, the electrostatic chuck is suitable for supporting semiconductor substrates. In embodiments, the backside of the electrostatic chuck contains a plurality of lift pin holes and helium holes. In embodiments, the cleaning fixture assembly includes a plate configured to align with and engage a backside of an electrostatic chuck, the plate having an annular seal portion surrounding a pocket; a first O-ring engaging the annular seal portion of the plate; a plurality of through-holes in the pocket of the plate; and a plurality of O-rings surrounding the plurality of through-holes in the pocket of the plate. In embodiments, the plurality of through-holes in the pocket of the plate are aligned with and in fluid communication with the lift pin holes and helium holes in the backside of the electrostatic chuck, and the plurality of O-rings are positioned to allow cleaning media to engage the lift pin holes and helium holes in the electrostatic chuck during a cleaning process, while sealing the cleaning media from reaching the backside of the electrostatic chuck.

The present disclosure also provides a method of cleaning an electrostatic chuck suitable for supporting semiconductor substrates. The method involves mounting an electrostatic chuck on a cleaning fixture assembly, where the cleaning fixture assembly includes a plate configured to align with and engage a backside of an electrostatic chuck, the plate having an annular seal portion surrounding a pocket; a first O-ring engaging the annular seal portion of the plate; a plurality of through-holes in the pocket of the plate; and a plurality of O-rings surrounding the plurality of through-holes in the pocket of the plate. The method further involves positioning the electrostatic chuck on the cleaning fixture assembly such that the plurality of through-holes are aligned with and in fluid communication with lift pin holes and helium holes in the backside of the electrostatic chuck, and then fastening the electrostatic chuck on the cleaning fixture assembly with a plurality of fastener members, such that the plate seals the backside region of the electrostatic chuck and the plurality of O-rings seal the lift pin holes and helium holes in the electrostatic chuck. The method further involves cleaning the electrostatic chuck with at least one cleaning medium. In embodiments, the cleaning medium circulates through the lift pin holes and helium holes in the electrostatic chuck during the cleaning process, but cannot reach the backside of the electrostatic chuck.

DETAILED DESCRIPTION

Methods and apparatuses for cleaning semiconductor processing equipment, in particular for cleaning electrostatic chucks for plasma processing apparatuses, are provided. In the following description, numerous specific details are set forth in order to provide a thorough understanding of embodiments described herein. It will be apparent, however, to one skilled in the art that embodiments herein may be practiced without some or all of these specific details. In other instances, well known process steps and/or structures have not been described in detail in order to not unnecessarily obscure the methods and apparatuses described herein.

Unless otherwise indicated, all numbers expressing quantities, conditions, and the like in the instant disclosure and claims are to be understood as modified in all instances by the term "about." The term "about" refers, for example, to numerical values covering a range of plus or minus 10% of the numerical value. The modifier "about" used in combination with a quantity is inclusive of the stated value.

In this specification and the claims that follow, singular forms such as "a", "an", and "the" include plural forms unless the content clearly dictates otherwise.

The terms "room temperature", "ambient temperature", and "ambient" refer, for example, to a temperature of from about 20° C. to about 25° C.

The term "new ESCs" refers, for example, to ESCs that have not been used in a plasma processing chamber for processing semiconductor substrates, and the term "used ESCs" refers, for example, to ESCs that have been used in a plasma processing chamber for processing semiconductor substrates.

Figure 1:
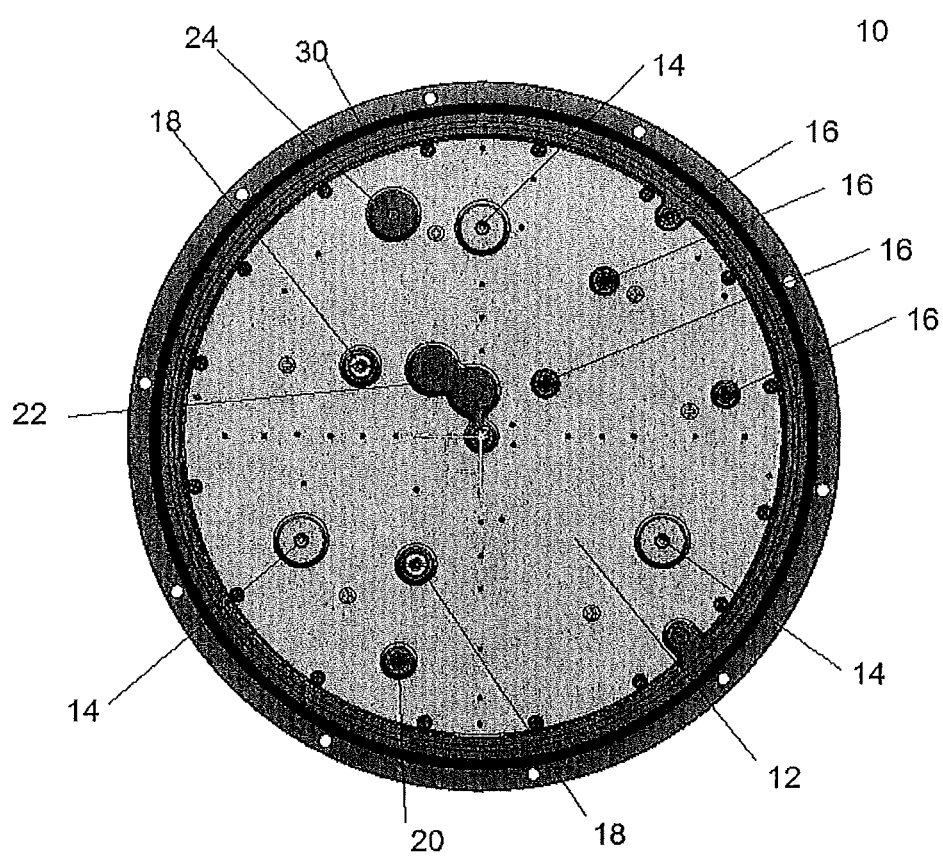
FIG. 1 depicts the backside of an exemplary electrostatic chuck.

The term "dielectric ESC" refers, for example, to an ESC used in dielectric etch processes such as plasma etching silicon oxide and low-k materials. In embodiments, an ESC may comprise a metal base (e.g., anodized or non-anodized aluminum alloy) with a ceramic surface on which a semiconductor or substrate such as a wafer is supported. For example, the ceramic surface may comprise a sintered laminate comprising a patterned refractory (e.g., tungsten or molybdenum) electrode between two ceramic layers (e.g., thin ceramic layers approximately 20 mils thick). The laminate may be bonded to the metal base with a bonding material such as a silicone-based material containing conductive powders (e.g., aluminum, silicon, or the like). The metal base, which may be approximately 1.5 inches thick, may include RF and DC power feeds, through holes for lift pins, helium gas passages, channels for temperature-controlled fluid circulation, temperature sensing arrangements, and the like. In embodiments, the backside of an ESC may contain sensitive components, such as electronic components. For example, FIG. 1 shows an illustration of one embodiment of the backside 10 of an exemplary electrostatic chuck comprising an embedded printed circuit board (PCB) 12, lift pin holes 14, temperature sensors 16, high voltage contact 18, a base plate temperature probe 20, water inlet and outlet 22, and helium through holes 24. An outer O-ring seal 30 is mounted on the backside region of the ESC.

During manufacture, contaminants may be deposited on the surfaces of a new ESC. Moreover, scanning electron microscopy (SEM) and energy dispersive spectroscopy (EDS) analysis of used ESCs reveals deposition of contaminants on ceramic ESC surfaces following etching. The contaminants change the surface characteristics of the ESCs and cause early failure, as ESC performance greatly depends on the cleanliness of ESC surfaces. The contaminants deposited on ESC surfaces during dielectric etching, as well as during manufacture of new ESCs, include, for example, organic impurities, metallic impurities, fluoride impurities, electrode impurities, silicon particles, surface particles, and combinations thereof. Fluoride impurities include, for example, aluminum fluoride, titanium fluoride, and combinations thereof; metallic impurities include, for example, iron, chromium, nickel, molybdenum, vanadium, and combinations thereof; electrode impurities include, for example, tungsten; and silicon impurities include, for example, Si, $SiO_2$, and combinations thereof. Contaminants such as, for example, organic impurities, metallic impurities, and electrode impurities are commonly found on new ESCs, while contaminants such as, for example, organic impurities, fluoride impurities, and silicon impurities may be deposited on the ceramic surface of used ESCs during dielectric etching.

In embodiments, new ESCs can be preconditioned and used ESCs can be recovered by cleaning the contaminants left on the ESCs during manufacturing or etching to refresh the ceramic surface by means of a cleaning process. Exemplary cleaning processes are described in, for example, U.S. Pat. Nos. 7,052,553, 7,648,582, 8,215,321, U.S. Patent Application Publication Nos. 2012/0073596, and U.S. Patent Application Publication No. 2013/0104930, each of which is commonly assigned and the entire disclosures of which are hereby incorporated by reference in their entireties.

However, it is not sufficient to simply remove contaminants from the ESC surface, as the contaminants can also be found within passages in the ESC, such as a lift pin groove or helium gas through-holes. Failure to remove contaminants from these passages compromises the cleanliness of the ESC, and the particles in the passages can contribute to particulate contamination. If the particles are not removed, they could affect at least one of the physical parameters of the electrostatic chuck, including, for example, resistance, capacitance, inductance, and impedance.

Cleaning media that are effective to remove contaminants on the surface of an ESC may also be used to remove contaminants from the passages in the ESC. However, the cleaning media could also adversely affect certain sensitive components of the ESC. For example, in embodiments, the ESC may contain an embedded printed circuit board (PCB) or other sensitive components distributed on the backside of the ESC, which could be adversely affected by contact with the cleaning media. Cleaning the passages (such as the helium holes and the lift pin holes) without protecting the backside of the ESC could lead to the cleaning media contacting these sensitive components. Due to the structure of some ESCs (i.e., because the sensitive components may be embedded or distributed across the backside of the ESC), simply blocking the sensitive components with a masking material or chemically resistant tape would not be effective—rather, the entire backside of the ESC must be protected. Blocking the through-passages and then injecting the cleaning media into the through-passages could protect the backside of the ESC, but it could also cause the cleaning media to spread onto the ceramic, potentially causing contamination.

In embodiments, an electrostatic chuck cleaning fixture assembly may be used to effectively protect the backside of the ESC while allowing cleaning media to contact and clean the through-holes in the ESC. For example, in embodiments, a cleaning fixture assembly for protecting an electrostatic chuck during a cleaning process comprises a plate configured to align with and engage a backside of an electrostatic chuck, the plate having an annular seal portion surrounding a pocket; a first O-ring engaging the annular seal portion of the plate; a plurality of through-holes in the pocket of the plate; and a plurality of O-rings surrounding the plurality of through-holes in the plate. The plurality of through-holes in the plate are configured to be aligned and in fluid communication with lift pin and helium holes in the backside of the electrostatic chuck. The plurality of O-rings are positioned to allow cleaning media to clean the lift pin holes and helium holes in the electrostatic chuck during a cleaning process, while also sealing the cleaning media from reaching the backside of the electrostatic chuck. That is to say, the cleaning media can circulate through the lift pin holes and helium holes but cannot contact the backside of the electrostatic chuck.

An electrostatic chuck may be positioned on the cleaning fixture assembly for protecting the electrostatic chuck during a cleaning process. In embodiments, the backside of the electrostatic chuck comprises a plurality of lift pin holes and helium holes which should be cleaned during the cleaning process so as to remove impurities that could later compromise the cleanliness of the ESC. In embodiments, the cleaning fixture assembly comprises a plate configured to align with and engage the backside of the electrostatic chuck, the plate having an annular seal portion surrounding a pocket; a first O-ring engaging the annular seal portion of the plate; a plurality of through-holes in the pocket of the plate; and a plurality of O-rings surrounding the plurality of through-holes in the plate. In embodiments, the plurality of through-holes in the pocket of the plate are aligned with and in fluid communication with the lift pin holes and helium holes in the backside of the electrostatic chuck, and the plurality of O-rings are positioned to allow cleaning media to circulate through the lift pin holes and helium holes in the electrostatic chuck during a cleaning process while sealing the cleaning media from reaching the backside of the electrostatic chuck.

When the ESC is installed on the cleaning fixture, the backside of the ESC is protected from the cleaning media during a cleaning process, while the cleaning media can still contact and clean other regions of the ESC, including the ceramic surface and the elastomer radial groove. The plurality of O-rings in the cleaning fixture assembly are configured to align with and seal lift pin and helium through-holes in the backside of the electrostatic chuck—thus, the cleaning media can circulate through the lift pin and helium holes in the electrostatic chuck, but cannot access the backside of the electrostatic chuck. In embodiments, while mounted on the cleaning assembly, the electrostatic chuck may be completely immersed in a cleaning medium (i.e., a cleaning agent) for greater than about 15 minutes, such as greater than about 20 minutes, or greater than about 25 minutes, or greater than about 30 minutes, or greater than about an hour, or greater than about 2 hours, without the cleaning media reaching the backside of the electrostatic chuck. Thus, sensitive elements (i.e., electronics/PCB) of the ESC which could be adversely affected by contact with water or chemicals are protected during the cleaning process, while the surface and through-holes of the ESC are effectively cleaned.

In embodiments, the number of through-holes in the plurality of through-holes in the pocket of the plate corresponds to the sum of the number of through-holes in the electrostatic chuck that must be cleaned (e.g., the sum of the helium holes and lift pin holes). For example, in an embodiment, an electrostatic chuck may contain one helium hole and three lift pin holes, and a corresponding cleaning fixture may contain four through-holes (one positioned to correspond with the helium hole, and three positioned to correspond with the lift pin holes).

In embodiments, the plurality of O-rings surrounding the plurality of through-holes are disposed in a plurality of grooves. In embodiments, the grooves are dove-tail grooves.

In embodiments, the pocket of the plate of the electrostatic chuck cleaning assembly has a pocket depth of less than about 0.1 inches, such as from about 0.01 to about 0.1 inches, or from about 0.02 to about 0.08 inches, or from about 0.03 to about 0.07 inches, or from about 0.04 to about 0.05 inches. In embodiments, the pocket depth may be selected to correspond to the topography of the backside of the electrostatic chuck to be cleaned. That is to say, in embodiments, the backside of an electrostatic chuck may comprise features which protrude above the flat surface of the backside of the electrostatic chuck, and the pocket depth of the plate may be selected to correspond to the height of those protruding features. For example, in embodiments, a feature of the backside of the electrostatic chuck (such as a screw or a plurality of screws disposed in the backside of the electrostatic chuck) may protrude above the flat surface of the ESC, such as from about 0.01 to about 0.1 inches above the flat surface of the ESC, or from about 0.02 to about 0.08 inches, or from about 0.03 to about 0.07 inches, or from about 0.04 to about 0.05 inches, and the depth of the pocket may correspond to the size of the protruding feature. In embodiments, the pocket depth may be the same, about the same, or slightly deeper than the height of a feature protruding from the flat surface of the ESC, such as from about 0.001 to about 0.01 inches deeper than the height of the protruding feature, or from about 0.002 to about 0.02 inches deeper, or from about 0.005 to about 0.05 inches deeper. In a preferred embodiment, the pocket depth matches the height of a feature protruding from the flat surface of the ESC. For example, if an ESC has a screw or a plurality of screws which protrude 0.043 inches above the flat surface of the ESC, the pocket depth of the plate of the electrostatic chuck cleaning assembly may be 0.043 inches.

In embodiments, a plurality of fastener members may be used to fasten the electrostatic chuck to the plate. For example, in embodiments, the electrostatic chuck may be attached to the plate by fastener members inserted in apertures in the plate. In embodiments, the plurality of fastener members may be disposed in circumferentially spaced holes around the plate. The fastener members may be, for example, threaded screws, bolts, or the like. In a preferred embodiment, the fastener members are screws, such as #10-32 screws. In embodiments, helicoils may be disposed in the apertures in the plate so as to increase the strength of the threaded connection with the fastener members.

In embodiments, the plurality of fastener members includes sufficient fastener members to achieve complete compression of O-rings and, consequently, ensure seal integrity. For example, in embodiments, the plurality of fastener members may include from about 3 to about 20 fastener members, such as from about 5 to about 15 fastener members, or from about 8 to about 12 fastener members, or about 10 fastener members. More particularly, the number and type of fastener members in the plurality of fastener members may be selected to correspond to the total load required to compress all O-rings in the cleaning fixture assembly. In embodiments, the net force applied by the plurality of fastener members is the same or greater than the total load required to compress all O-rings (i.e., the first O-ring and the plurality of O-rings) in the cleaning fixture assembly. In embodiments, the plurality of fastener members comprises sufficient fastener members to achieve complete compression of the O-rings in the cleaning fixture assembly and, consequently, ensure seal integrity.

In embodiments, the plate of the cleaning fixture assembly may comprise at least one orientation feature positioned to correspond with a feature on the electrostatic chuck, such that when the feature on the electrostatic chuck is aligned with the at least one orientation feature, the electrostatic chuck and the cleaning fixture assembly may be properly positioned (1) for attachment to each other and (2) to carry out the cleaning process. In embodiments, at least one orientation feature may be used to align a dowel in the cleaning fixture with an ESC alignment slot, such that when the at least one orientation feature is aligned with a particular feature in the ESC, the dowel pin in the cleaning fixture is aligned with and clocked to a mounting ESC hole, which in turn ensures that the O-rings in the cleaning fixture assembly line up correctly with the intended features. For example, in embodiments, the orientation feature may assist in positioning the electrostatic chuck relative to the cleaning fixture assembly, such that when the feature on the electrostatic chuck is aligned with the at least one orientation feature on the plate, the plurality of through-holes are aligned with and in fluid communication with lift pin holes and helium holes in the backside of the electrostatic chuck, and the plurality of O-rings surrounding the plurality of through-holes are properly positioned to seal the lift pin and helium holes in the electrostatic chuck. Any suitable orientation feature may be used. For example, in embodiments, the orientation feature may be a hole, a bore, an alignment dowel, or a visual identification or marking scribed on the cleaning fixture assembly.

Figure 2:
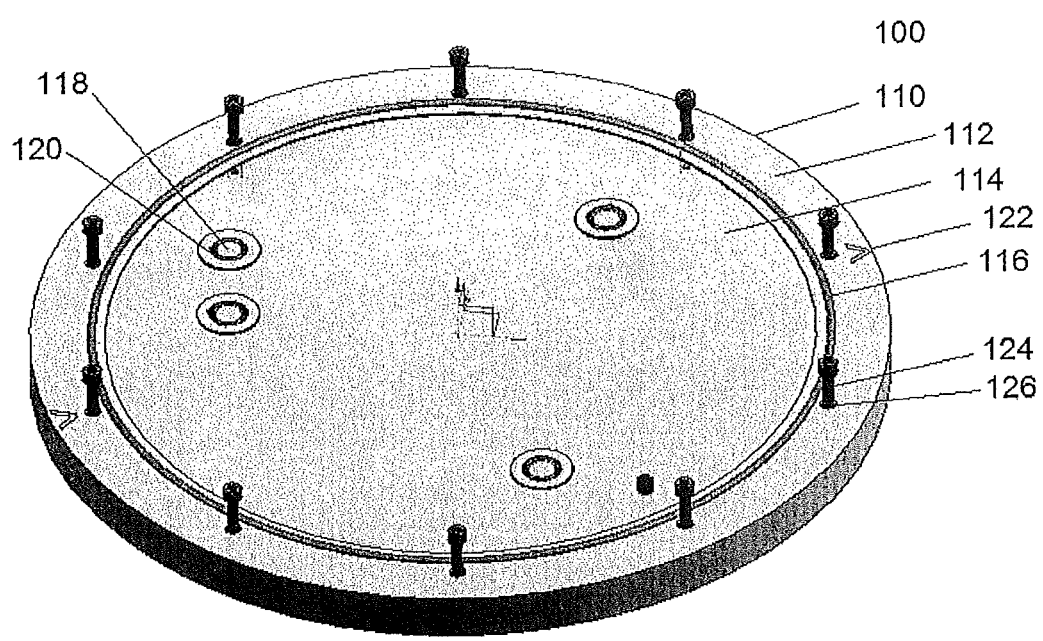
FIG. 2 depicts an embodiment of a cleaning fixture assembly constructed for use in cleaning an electrostatic chuck.

An exemplary embodiment of the cleaning fixture assembly 100 constructed to clean an electrostatic chuck is shown in FIG. 2. The cleaning fixture assembly 100 comprises a plate 110 having an annular seal portion 112 surrounding a pocket 114. The cleaning fixture assembly is configured to align with and seal the backside of an electrostatic chuck (not pictured). A first O-ring 116 engages the annular seal portion 112 of the plate 110.

The plate 110 has a plurality of through-holes 118 disposed in the pocket of the plate. The plurality of through-holes 118 are configured to be aligned with and in fluid communication with lift pin holes and helium holes in the backside of the electrostatic chuck (not pictured)—that is to say, the through-holes 118 have dimensions approximating those of the lift pin and helium holes in the electrostatic chuck, and they are located in the pocket 114 of the plate 110 such that they correspond to the location of the lift pin and helium holes in the electrostatic chuck. A plurality of O-rings 120 disposed in the pocket 114 of the plate 110 surround the plurality of through-holes 118. The plurality of through-holes 118 and plurality of O-rings 120 are positioned such that when an electrostatic chuck is mounted on the cleaning fixture assembly 100, the plurality of through-holes 118 align with and are in fluid communication with the helium holes and lift pin holes in the electrostatic chuck, and during a cleaning process, the plurality of O-rings 120 block cleaning media from reaching the backside of the electrostatic chuck while still allowing the cleaning media to engage the lift pin holes and helium holes.

The cleaning fixture assembly 100 also comprises orientation markings 122, which can be used to properly situate an electrostatic chuck on the cleaning fixture assembly 100 (i.e., to situate the electrostatic chuck such that the lift pin holes and helium holes align with the through-holes 118 and the plurality of O-rings 120). When the visual markings on the cleaning fixture assembly 100 are aligned with a feature on the electrostatic chuck, a dowel pin 130 disposed in the plate 110 is aligned and clocked to a mounting ESC hole (not pictured), which in turn ensures that the O-rings in the cleaning fixture assembly line up correctly with the intended features.

The cleaning fixture assembly 100 also includes a plurality of fastening members 124 disposed in circumferentially spaced holes 126 around the plate 110 to fasten the electrostatic chuck (not pictured) to the plate 110. Helicoils (not pictured) may also be disposed in the holes 126 to increase the strength of the threaded connection.

Figure 3:
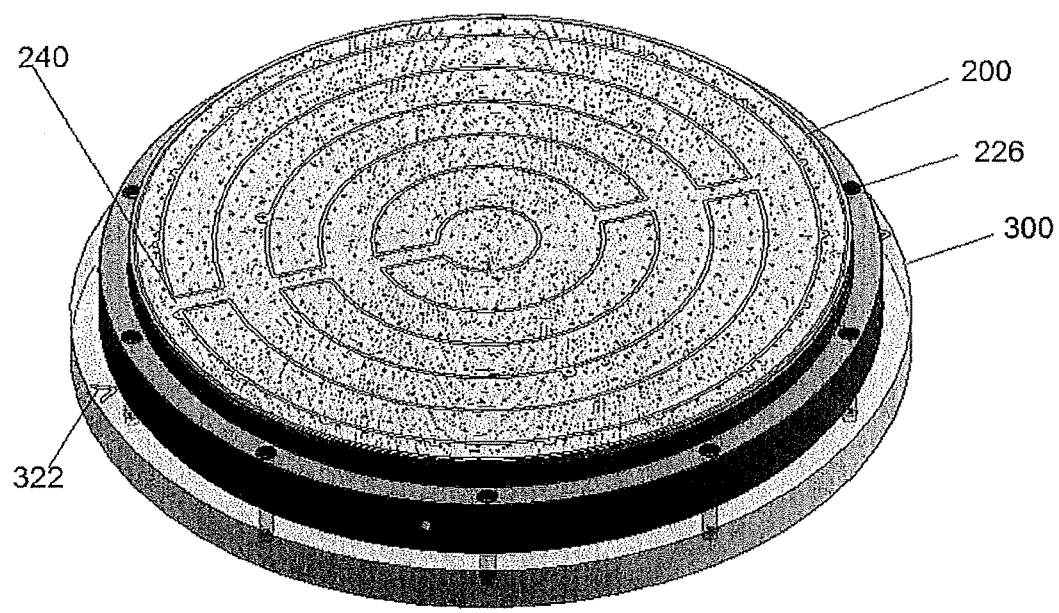
FIG. 3 depicts an embodiment of an electrostatic chuck mounted on a cleaning fixture assembly.

FIG. 3 shows an exemplary embodiment of an electrostatic chuck 200 mounted on a cleaning fixture assembly 300. The electrostatic chuck 200 is attached to the cleaning fixture assembly 300 by a plurality of fastener members (not pictured) disposed in holes 226. A plurality of helicoils (not pictured) may also be disposed in the holes 226 to increase the strength of the threaded connection with the fastener members. The cleaning fixture assembly 300 includes orientation features 322, which can be used to properly situate the electrostatic chuck 200 on the cleaning fixture assembly 300. The orientation features 322 (shown as a visual marking on the cleaning fixture assembly 300) are aligned with a feature 240 on the electrostatic chuck 200.

After the ESC has been affixed to the cleaning fixture, the ESC may be subjected to a cleaning process. Any desired cleaning method or media may be used. In embodiments, the cleaning method and/or cleaning media used for cleaning the electrostatic chuck may be selected based on its ability to effectively remove a particular impurity. In embodiments, the material of the cleaning fixture assembly (including the plate and the O-rings) may be selected based on the cleaning method and/or cleaning media—that is to say, degradation of the materials of the cleaning fixture assembly by the particular cleaning method and/or cleaning media is undesirable, and thus in embodiments, it is preferable to select materials for the cleaning fixture assembly that are compatible (i.e., chemically compatible) with the cleaning media, the cleaning method, and/or the cleaning duration.

In embodiments, the first O-ring and the plurality of O-rings are composed of a rubber material, preferably a rubber material that is chemically compatible with the desired cleaning media. In embodiments, the rubber material has a Shore A hardness in a range of from about 30 to about 100, such as from about 35 to about 95, or from about 40 to about 90. The rubber material may be any suitable material, such as VITON rubber (a fluoroelastomer based on the copolymer of vinylidene fluoride and hexafluoropropylene, which is commercially available from DuPont of Wilmington, Del.), polyurethane rubber, ethylenepropylene rubber, or fluoropolymer rubber, in particular high purity fluoropolymer rubbers such as the fluoropolymer rubbers sold under the trade names KALREZ (available from DuPont of Wilmington, Del.) and CHEMRAZ (available from Green Tweed & Co.). The composition of the first O-ring and each O-ring within the plurality of O-rings may be the same or different.

In embodiments, the plate of the cleaning fixture assembly is composed of a suitable material that is compatible with the selected cleaning media. For example, in embodiments, the plate of the cleaning fixture assembly may be made of stainless steel, aluminum, anodized aluminum, or any other suitable material. In a preferred embodiment, the plate is anodized aluminum.

The cleaning fixture assembly may be used in combination with any suitable cleaning method and/or cleaning media. In embodiments, the electrostatic chuck may optionally be subjected to an optional pre-cleaning procedure, particularly if the electrostatic chuck is considered to be highly contaminated (i.e., if the contamination level is sufficiently severe as to be visible to the eye). The pre-cleaning procedure may include subjecting the ESC to a spray of deionized (DI) water. The ESC may be sprayed until loose surface deposition is removed. For example, in embodiments, the ESC may be sprayed for about one to about 20 minutes, such as from about 3 to about 15 minutes, or from about 5 to about 10 minutes. After cleaning the ESC with water, the ESC may be dried. In embodiments, drying may be accomplished using clean, dry air or the like.

In embodiments, the cleaning process comprises contacting the electrostatic chuck with at least one cleaning medium. The terms "contact" and "contacting" refer, for example, to applying a cleaning medium to the electrostatic chuck by any suitable technique which is effective to remove undesired substances present on the electrostatic chuck. In embodiments, the cleaning media may be, for example, acid, base, water, isopropyl alcohol, or air. Wet cleaning methods for cleaning electrostatic chucks are described, for example, in commonly assigned U.S. Pat. No. 7,052,553.

In embodiments, the cleaning media used to clean a given electrostatic chuck may be selected based on the cleaning media's efficacy in removing particular contaminants. For example, organic solvents such as isopropyl alcohol may be used to remove organic impurities.

Basic solutions also serve to remove organic impurities, as well as metallic impurities and titanium fluoride. In embodiments, a basic solution used as the cleaning media may be a weak basic solution including, for example, hydrogen peroxide, ammonium hydroxide, or mixtures thereof. Hydrogen peroxide is a strong oxidizer with a high standard reduction potential, and is effective to break organic bonds and react with metals and metal ions. Hydrogen peroxide can react with metal to form metal ions in a weak basic solution of ammonium hydroxide and hydrogen peroxide, which is stable up to at least 70° C. Ammonium hydroxide can form complex ions with metallic impurities (including heavy metals such as Ni, Cr, Co, and Cu). Because the use of hydrogen peroxide increases the surface potential of ESC ceramic surfaces, it can reduce the redeposition or surface absorption of metals after previous chemical cleaning of ESC ceramic surfaces. In embodiments, the basic solution is a mixture of ammonium hydroxide and hydrogen peroxide having a volume ratio of $NH_4OH:H_2O_2:H_2O$ of, for example, from about 1:1:2-8 or 1:x:8 (where x=2-7). For example, in embodiments, the ratio may be about 1:1:2. In embodiments, the ESC may be immersed in the basic solution at a temperature from about 18° C. to about 30° C., such as from about 20° C. to about 25° C., for from about 5 minutes to about an hour, such as from about 10 minutes to about 45 minutes, or from about 20 minutes to about 30 minutes. In embodiments, the ESC may be rinsed with deionized water to remove residual solution and contaminants and then dried. Drying may be carried out with, for example, nitrogen.

Tetramethyl ammonium hydroxide (TMAH) may be used to remove aluminum fluoride, a contaminant that may be found on used ESCs. Thus, TMAH may be particularly useful for cleaning used ESCs.

In embodiments, the cleaning media may comprise an acidic solution. In embodiments, the acid solution is effective to remove contaminants such as Ca, Mg, Fe, Na, K, Al, Si, Ti, Cu, Zn, Li, Ni, Cr, and/or Mo. Acidic solutions used as the cleaning media may include, for example, hydrofluoric acid (HF), nitric acid ($HNO_3$) and mixtures thereof. For example, nitric acid serves to remove metal particles and electrode impurities, and hydrofluoric acid serves to remove silicon particles, such as $SiO_2$. That is to say, the hydrofluoric acid dissolves silicon and $SiO_2$-based materials, and the nitric acid dissolves metal ions, oxides, and inorganic etch by-products. In embodiments, the acidic solution comprises from about 1 to about 5 weight percent hydrofluoric acid (49%, semiconductor grade, conforming to SEMI Specification C28-0301, Grade 1 or better), such as from about 1 to about 3 weight percent hydrofluoric acid, or about 1 weight percent hydrofluoric acid; and from about 5 to about 20 weight percent nitric acid (67%, semiconductor grade, conforming to SEMI Specification C35-0301, Grade 1 or better), such as from about 5 to about 20 weight percent nitric acid, such as from about 7 to about 15 weight percent nitric acid, or from about 10 to about 13 weight percent hydrofluoric acid, or about 10 weight percent hydrofluoric acid; and water.

Acidic solutions which may be used as a cleaning medium may also comprise, for example, hydrochloric acid and hydrogen peroxide such an acidic solution is effective to remove metallic impurities and electrode impurities. Metal particles such as iron, nickel, titanium, etc. can be effectively removed by a solution of hydrochloric acid and hydrogen peroxide, as iron and nickel can dissolve in hydrochloric acid and titanium can be oxidized by hydrogen peroxide and then dissolve in a solution of hydrochloric acid.

In embodiments, the acidic solution may comprise a mixture of hydrofluoric acid and nitric acid and/or a mixture of hydrochloric acid and hydrogen peroxide. The acidic solution or solutions used may be based on the type of ESC and the conditions to which it is subjected during dielectric etching.

In embodiments, the ESC may be rinsed with deionized water for a suitable time, such as from about 1 to about 15 minutes, or from about 2 to about 10 minutes, or about 5 minutes, to remove any residue of the cleaning media. In embodiments, the cleaning process may be carried out more than once, such as more than two times, or more than three times, or more than four times.

In embodiments, the cleaning process comprises ultrasonically cleaning the electrostatic chuck disposed on the cleaning fixture. Ultrasonic cleaning serves to remove surface particles, as well as particles trapped inside passages in the ESC, such as water channels, temperature sensor holes, lift pin holes, and through-holes, such as helium supply holes and associated microchannels. In embodiments, ultrasonically cleaning the electrostatic chuck comprises immersing a surface of the ESC in a cleaning medium and subjecting the cleaning medium to ultrasonic agitation. In embodiments, ultrasonically cleaning the ESC may be followed by rinsing the ESC (such as with deionized water) and/or baking the ESC. Methods of ultrasonically cleaning an electrostatic chuck using ultrasonic agitation are described, for example, in U.S. Pat. No. 7,648,582. In embodiments, a particle density on the ESC ceramic surface and in the through-holes of less than about 0.17 particles/$cm^2$, such as less than about 0.15 particles/$cm^2$, or less than about 0.10 particles/$cm^2$, is desired following ultrasonic cleaning.

In embodiments, ultrasonic cleaning is carried out in a cleaning medium, such as ultrapure water. In embodiments, the ultrapure water has a resistivity of about 15 Mohm-cm at about ambient temperature. In embodiments, the ultrasonic cleaning has a duration of from about 5 minutes to about 90 minutes, such as from about 10 minutes to about 60 minutes, or from about 20 to about 40 minutes, or about 30 minutes. In embodiments, the ultrasonic cleaning may be carried out more than once, such as two or more times, or three or more times, or four or more times.

In embodiments, the cleaning process can be followed by other conventional cleaning steps.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A cleaning fixture assembly for protecting an electrostatic chuck during a wet cleaning process, the electrostatic chuck being suitable for supporting semiconductor substrates, the cleaning fixture assembly comprising:
   a sealing plate capable of aligning with and engaging a backside of the electrostatic chuck, the sealing plate including:
   a pocket formed on a surface of the sealing plate, the pocket having a pocket depth and being capable of receiving the backside of the electrostatic chuck; and
   an annular seal portion surrounding the pocket, the annular seal portion having a diameter greater than that of the backside of the electrostatic chuck such that the annular seal portion extends outwardly beyond the backside of the electrostatic chuck and is capable of surrounding the backside of the electrostatic chuck with which the sealing plate is aligning;

a first O-ring engaging the annular seal portion of the sealing plate;

a plurality of through-holes in the pocket of the sealing plate, the plurality of the through-holes being all of the through-holes formed in the pocket; and a plurality of second O-rings each surrounding corresponding one of the plurality of through-holes in the pocket of the sealing plate such that all of the through-holes formed in the pocket of the sealing plate are surrounded by the second O-rings, wherein:

the plurality of through-holes are arranged to align with passages formed in the backside of the electrostatic chuck, the passages including lift pin holes and helium holes in the backside of the electrostatic chuck, the through-holes being capable of providing fluid communication with the passages thereby allowing cleaning media to circulate therethrough, and the plurality of second O-rings are positioned to allow the cleaning media to engage the passages in the electrostatic chuck while sealing the cleaning media from reaching the backside of the electrostatic chuck during the wet cleaning process.

2. The cleaning fixture assembly according to claim 1, wherein the pocket corresponds to the height of a feature protruding from the backside of the electrostatic chuck.

3. The cleaning fixture assembly according to claim 2, wherein the pocket depth is less than 0.1 inch.

4. The cleaning fixture assembly according to claim 1, further comprising a plurality of fastener members disposed in circumferentially spaced holes around the sealing plate to fasten the electrostatic chuck to the sealing plate, the plurality of fastener members being capable of fully compressing all of the first and second O-rings whereby providing seal integrity during the wet cleaning process.

5. The cleaning fixture assembly according to claim 4, wherein the plurality of fastener members comprises from 3 to about 20 screws.

6. The cleaning fixture assembly according to claim 1, wherein the sealing plate is made of a material selected from the group consisting of stainless steel, aluminum, and anodized aluminum.

7. A method of cleaning an electrostatic chuck suitable for supporting semiconductor substrates, the method comprising:

mounting the electrostatic chuck on a cleaning fixture assembly, the cleaning fixture assembly comprising:

a sealing plate capable of aligning with and engaging a backside of an electrostatic chuck, the sealing plate including:

a pocket formed on a surface of the sealing plate, the pocket having a pocket depth and capable of receiving the backside of the electrostatic chuck; and an annular seal portion surrounding the pocket, the annular seal portion having a diameter greater than that of the backside of the electrostatic chuck such that the annular seal portion extends outwardly beyond the backside of the electrostatic chuck and is capable of surrounding the backside of the electrostatic chuck with which the sealing plate is aligning;

a first O-ring engaging the annular seal portion of the sealing plate;

a plurality of through-holes in the pocket of the sealing plate, the plurality of through-holes being all of the through-holes formed in the pocket; and a plurality of second O-rings each surrounding corresponding one of the plurality of through-holes in the pocket of the sealing plate, such that the all of the through-holes formed in the pocket are surrounded by the second O-rings;

positioning the electrostatic chuck on the cleaning fixture assembly such that the plurality of through-holes are aligned with and in fluid communication with passages formed in the backside of the electrostatic chuck, the passages including lift pin holes and helium holes in the backside of the electrostatic chuck;

fastening the electrostatic chuck on the cleaning fixture assembly such that the sealing plate seals the backside region of the electrostatic chuck, and the plurality of second O-rings seal the passages in the electrostatic chuck; and cleaning the electrostatic chuck by circulating wet cleaning media through the passages via the through-holes, wherein the plurality of second O-rings are positioned to allow the wet cleaning media to engage the passages in the electrostatic chuck while sealing the wet cleaning media from reaching the backside of the electrostatic, such that the wet cleaning media cleans the passages in the electrostatic chuck but does not reach the backside of the electrostatic chuck during the cleaning of the electrostatic chuck by circulating the wet cleaning media through the passages via the through-holes.

8. The method according to claim 7, wherein the wet cleaning media is selected from the group consisting of acid, base, water, and isopropyl alcohol.

9. The method according to claim 7, wherein the material of the sealing plate, the first O-ring, and the plurality of second O-rings are selected to be compatible with the wet cleaning media.

10. The method according to claim 7, wherein cleaning the electrostatic chuck comprises ultrasonic cleaning in which the electrostatic chuck is immersed in the wet cleaning media.

11. The method according to claim 10, wherein the ultrasonic cleaning has a duration of from about 5 minutes to about 90 minutes.

12. The method according to claim 10, wherein following ultrasonic cleaning, a particle density of particles remaining on a ceramic surface and in the through-holes of the electrostatic chuck is less than about 0.15 particles/cm$^2$.

13. The method according to claim 7, wherein the cleaning fixture assembly further comprises a plurality of fastener members disposed in circumferentially spaced holes around the sealing plate, and the electrostatic chuck is fastened to the sealing plate with the plurality of fastener members such that all of the first and second O-rings are fully compressed so as to provide seal integrity during the cleaning of the electrostatic chuck by circulating the wet cleaning media.

* * * * *